(12) United States Patent
Guo et al.

(10) Patent No.: US 9,627,051 B2
(45) Date of Patent: *Apr. 18, 2017

(54) NON-VOLATILE MEMORY INCLUDING REFERENCE SIGNAL PATH

(71) Applicant: Micron Technology, Inc., Boise, ID (US)

(72) Inventors: Xinwei Guo, Folsom, CA (US); Richard E Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/715,126

(22) Filed: May 18, 2015

(65) Prior Publication Data

US 2015/0255154 A1    Sep. 10, 2015

Related U.S. Application Data

(63) Continuation of application No. 13/596,934, filed on Aug. 28, 2012, now Pat. No. 9,042,154.

(51) Int. Cl.
| | |
|---|---|
| *G11C 13/00* | (2006.01) |
| *G11C 5/14* | (2006.01) |
| *G11C 11/56* | (2006.01) |
| *G11C 16/26* | (2006.01) |
| *G11C 29/02* | (2006.01) |

(52) U.S. Cl.
CPC .......... *G11C 13/0021* (2013.01); *G11C 5/147* (2013.01); *G11C 11/5678* (2013.01); *G11C 13/0002* (2013.01); *G11C 13/0004* (2013.01); *G11C 13/004* (2013.01); *G11C 16/26* (2013.01); *G11C 29/021* (2013.01); *G11C 29/028* (2013.01); *G11C 2013/0054* (2013.01); *G11C 2211/5634* (2013.01); *G11C 2211/5645* (2013.01)

(58) Field of Classification Search
USPC ........................................................ 365/148
See application file for complete search history.

(56) References Cited

U.S. PATENT DOCUMENTS

| | | | |
|---|---|---|---|
| 6,385,091 | B1 | 5/2002 | Pekny |
| 7,426,134 | B2 | 9/2008 | Happ et al. |
| 7,535,783 | B2 | 5/2009 | DeBrosse et al. |
| 7,719,913 | B2 | 5/2010 | Lung et al. |
| 7,881,119 | B2 | 2/2011 | Fukushima |
| 8,027,187 | B2 | 9/2011 | Taylor et al. |
| 9,042,154 | B2 | 5/2015 | Guo et al. |

(Continued)

*Primary Examiner* — James G Norman
(74) *Attorney, Agent, or Firm* — Schegman Lundberg & Woessner, P.A.

(57) ABSTRACT

Some embodiments include apparatuses and methods having a first memory element and a first select component coupled to the first memory element, a second memory element and a second select component coupled to the second memory element, and an access line shared by the first and second select components. At least one of the embodiments can include a circuit to generate a signal indicating a state of the second memory element based on a first signal developed from a first signal path through the first memory element and a second signal developed from a second signal path through the second memory element.

20 Claims, 8 Drawing Sheets

(56) References Cited

U.S. PATENT DOCUMENTS

| | | | |
|---|---|---|---|
| 2009/0237984 A1* | 9/2009 | Porter | G11C 13/0004 |
| | | | 365/163 |
| 2009/0323393 A1* | 12/2009 | Scheuerlein | G11C 7/22 |
| | | | 365/148 |
| 2010/0290278 A1* | 11/2010 | Kim | G11C 13/0004 |
| | | | 365/163 |
| 2011/0075468 A1* | 3/2011 | Scheuerlein | G11C 13/0007 |
| | | | 365/148 |
| 2012/0092941 A1* | 4/2012 | Porter | G11C 13/0004 |
| | | | 365/189.15 |
| 2012/0307553 A1* | 12/2012 | Bedeschi | G11C 11/5678 |
| | | | 365/163 |
| 2013/0010524 A1* | 1/2013 | Porter | G11C 13/0004 |
| | | | 365/148 |
| 2014/0063897 A1 | 3/2014 | Guo et al. | |
| 2014/0211553 A1* | 7/2014 | Lai | G11C 29/025 |
| | | | 365/163 |
| 2014/0226417 A1* | 8/2014 | Lai | G11C 29/025 |
| | | | 365/189.09 |
| 2016/0148678 A1* | 5/2016 | Park | G11C 13/004 |
| | | | 365/148 |

* cited by examiner

300A

300B

NON-VOLATILE MEMORY INCLUDING REFERENCE SIGNAL PATH

PRIORITY APPLICATION

This application is a continuation of U.S. application Ser. No. 13/596,934, filed Aug. 28, 2012, which is incorporated herein by reference in its entirety.

BACKGROUND

Computers and other electronic items, for example, digital televisions, digital cameras, and cellular phones, often have one or more memory devices to store information. Such memory devices usually have numerous memory cells to store information. The value of information stored in the memory cells can be determined by performing a memory operation, such as a read operation. As device size in these memory devices shrinks, relative dimensions among memory cells and other features in the device may change. Thus, memory operations involving these features in the device may be affected. For example, accurately determining the value of information stored in memory cells in these memory devices may become more difficult.

DETAILED DESCRIPTION

Figure 1:
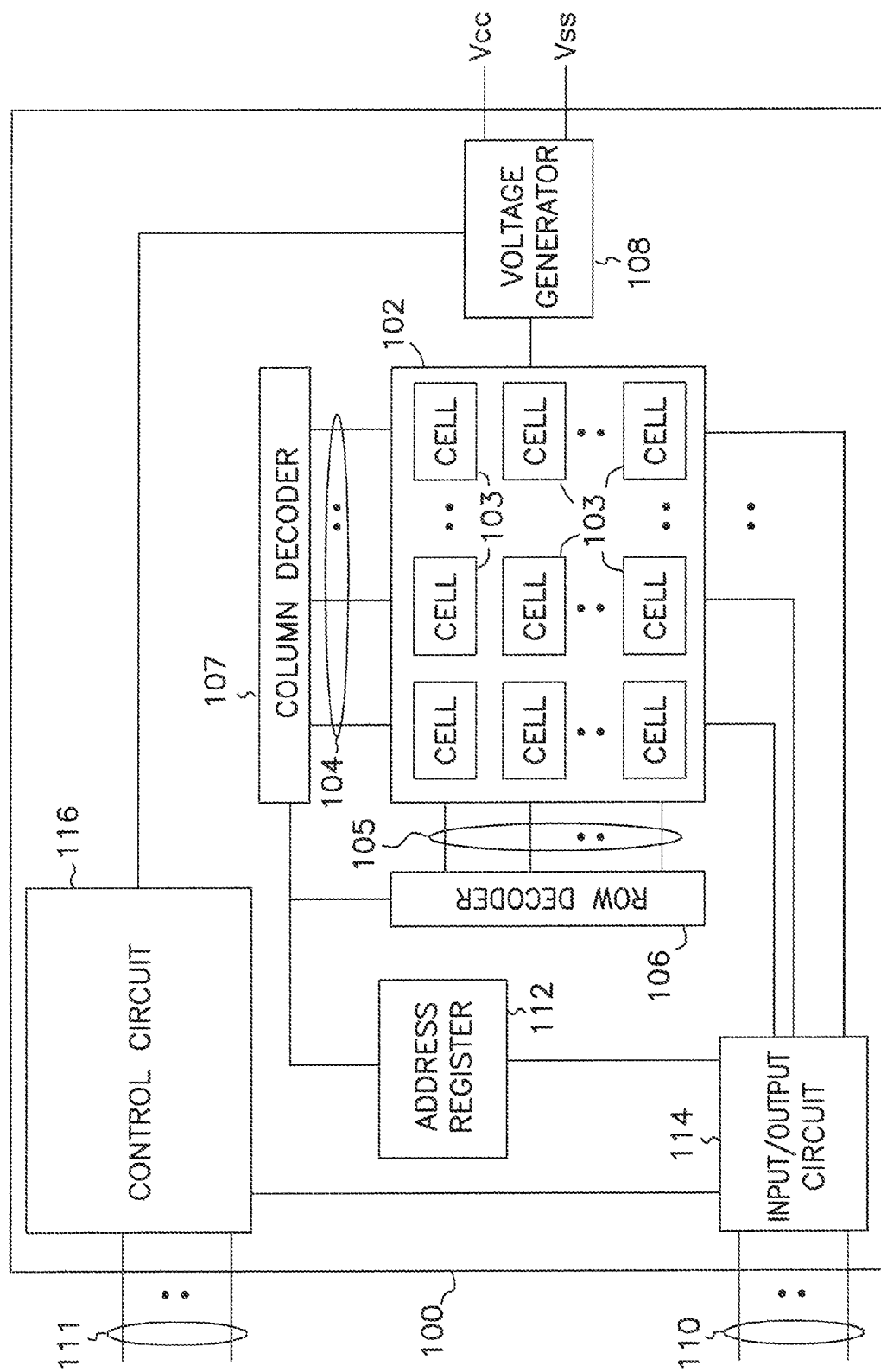
FIG. 1 shows a block diagram of an apparatus in the form of a memory device, according to an embodiment of the invention.

FIG. 1 shows a block diagram of an apparatus in the form of a memory device 100, according to an embodiment of the invention. A memory device, such as memory device 100, can include any device having some memory capability, such as, but not limited to, stand alone memories, managed memories, processors and/or CPUs and/or logic circuits with embedded memory, sensors and/or other devices using code and/or data and/or parameter storage.

As shown in FIG. 1, memory device 100 can include a memory array 102 having memory cells 103 that can be arranged in rows and columns along with lines (e.g., data lines) 104 and lines (e.g., access lines) 105. Memory device 100 can include a row decoder 106 and a column decoder 107 coupled to memory cells 103 through lines 105 and lines 104, respectively.

Row and column decoders 106 and 107 can be configured to respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 (e.g., pins, solder balls, or other interconnect technologies such as controlled collapse chip connection (C4) or flip chip attach (FCA)) on a package where the memory device 100 can reside.

A control circuit 116 can control operations of memory device 100 based on signals present on lines 110 and 111. A device (e.g., a processor or a memory controller, not shown in FIG. 1) external to memory device 100 can send different commands (e.g., read, write, and erase commands) to memory device 100 using different combinations of signals on lines 110, 111, or both.

Memory device 100 can be configured to respond to commands to perform memory operations, such as a read operation to determine information from memory cells 103 and a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a voltage generator 108. Control circuit 116 and voltage generator 108 can be configured to generate different voltages for use during memory operations of memory device 100. For example, voltages generated by voltage generator 108 can be applied (e.g., in the form of signals) to lines 104 and 105 during a read or write operation to access memory cells 103.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" for two bits, or one of eight possible values "000", "001", "010", "011", "100", "101", "110", and "111" for three bits, or one of other values for another number of multiple bits. A memory cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a variable resistance memory device (e.g., a phase change memory (PCM) device or a resistive random access memory (RRAM) device), or another kind of memory device.

In memory device 100, each of memory cells 103 can include a material. At least a portion of the material can be programmed to change between different states. The different states can have different resistance values. Such resistance values can be configured to represent different values of information stored in each of memory cells 103.

Memory device 100 can include a memory device where memory cells 103 can be physically located in multiple levels on the same device. For example, some of memory cells 103 can be stacked over some other memory cells 103 in multiple levels over a substrate (e.g., a semiconductor substrate) of memory device 100.

One of ordinary skill in the art may recognize that memory device 100 can include other features. FIG. 1 omits such features so as not to obscure some example embodiments described herein.

Memory device 100 may include memory devices and operate using memory operations similar to or identical to memory devices and operations described below with reference to FIG. 2A through FIG. 5.

Figure 2A:
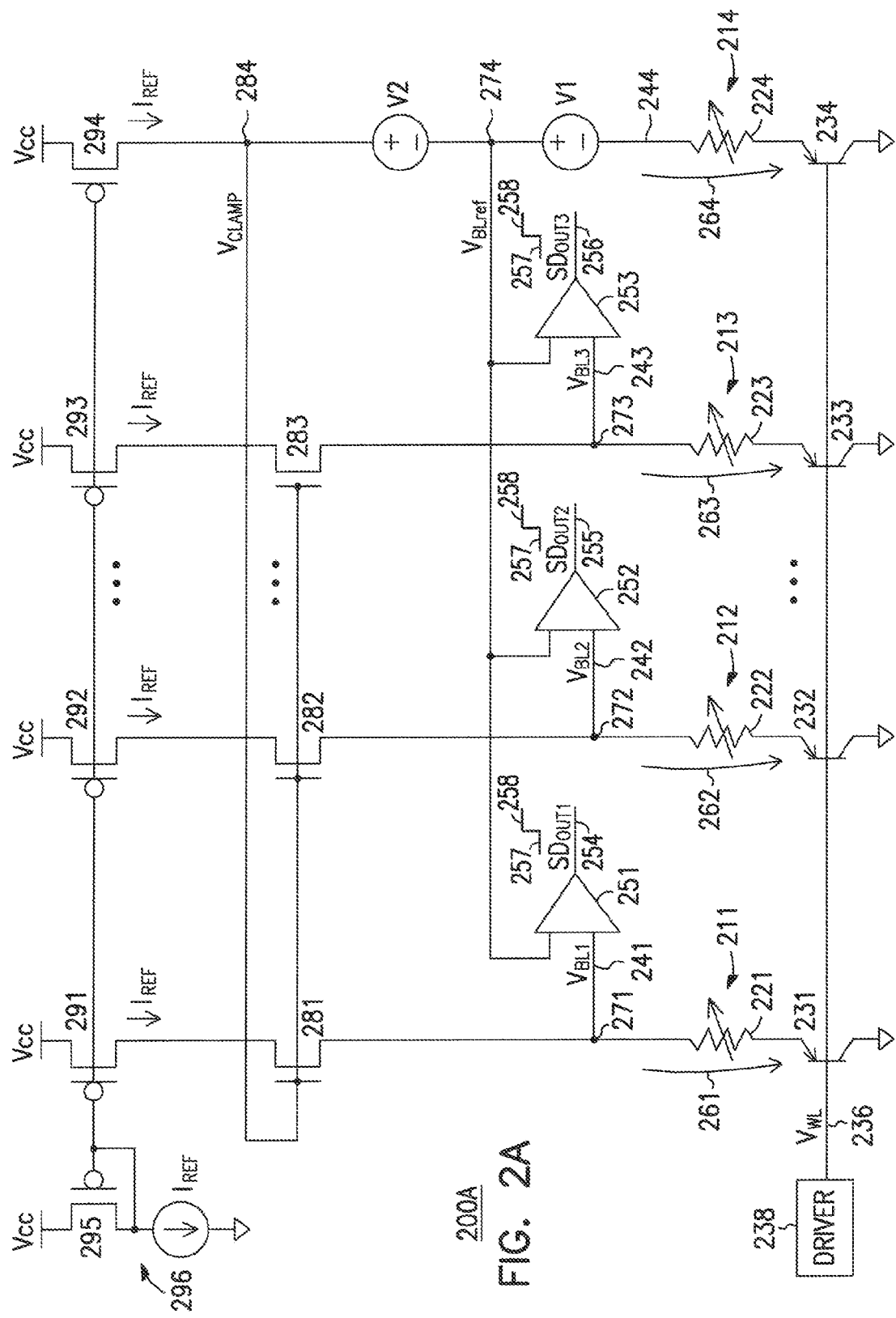
FIG. 2A shows a schematic diagram of a portion of a memory device having a reference signal path, according to an embodiment of the invention.

FIG. 2A shows a schematic diagram of a portion of a memory device 200A having a reference signal path 264, according to an embodiment of the invention. Memory device 200A can include memory cells 211, 212, 213, and 214 having corresponding memory elements 221, 222, 223, and 224. Memory elements 221, 222, 223, and 224 can be located in the same memory array of memory device 200A. Memory elements 221, 222, 223, and 224 can be physically arranged in the same row (or same column) in the memory array of memory device 200A.

Each of memory elements 221, 222, 223, and 224 can include a variable resistance material, which is shown in FIG. 2A as a variable resistor symbol. At least a portion of the material in each of memory elements 221, 223, 223, and 224 can be configured (e.g., programmed) to change between different states. The states can include a lower resistance state (e.g., a set state) and a higher resistance state (e.g., a reset state). The different states can have different resistance values. Such resistance values can be configured to represent different values of information stored in each of memory elements 221, 222, 223, and 224. Examples of variable resistance materials include phase change materials. An example of a phase change material includes a chalcogenide material. Examples of chalcogenide materials include various combinations of germanium (Ge), antimony (Sb), tellurium (Te), and/or other similar materials.

As shown in FIG. 2A, memory device 200A can include select components 231, 232, 233, and 234 coupled to respective memory elements 221, 222, 223, and 224. Each of select components 231, 232, 233, and 234 can include a bipolar junction transistor (BJT), such as a PNP bipolar junction transistor. FIG. 2A (and other figures herein) uses BJTs for select components 231, 232, 233, and 234 as an example. Other types of select components can be used. For example, diodes or other non-ohmic devices can be used for select components 231, 232, 233, and 234.

Memory device 200A can include an access line 236, which can correspond to at least part of a word line of a memory device (e.g., memory device 200A). Select components 231, 232, 233, and 234 can share access line 236, such that the bases of the bipolar junction transistors of select components 231, 232, 233, and 234 can be coupled to access line 236. Thus, the same signal, such as a signal $V_{WL}$, on access line 236 can be used to control (e.g., turn on or turn off) select components during a memory operation (e.g., a read, write, or erase operation). Select components 231, 232, 233, and 234 can be physically arranged in a same row (or same column) in memory device 200A.

Memory device 200A can include a driver 238 (e.g., a word line driver) to apply signal $V_{WL}$ to access line 236 and the bases of the bipolar transistors of select components 231, 232, 233, and 234 during a memory operation. Driver 238 can be part of a decoding circuit (e.g. a row decoder, such as row decoder 106) of memory device 200A.

Memory device 200A can include data lines 241, 242, 243, and 244 coupled to respective memory elements 221, 222, 223, and 224. Data lines 241, 242, 243, and 244 can correspond to at least part of bit lines (e.g., local bit lines) of a memory device (e.g., memory device 200A). Data lines 241, 242, 243, and 244 can be structured as a group of data lines that can physically extend in the same direction. Data lines 241, 242, 243, and 244 can include local data lines and can be located in the same memory array of memory device 200A. Memory elements 221, 222, 223, and 224 can be similarly or identically structured. Data lines 241, 242, 243, and 244 can be similarly or identically structured. Memory device 200A may not use memory element 224 to store information (e.g., data). Memory device 200A may not use data line 244 to determine information (e.g., sense the state) of memory element 224. Memory device 200A can use memory element 224 as a reference memory element and data line 244 as a reference data line. The reference memory element and reference data line can form part of reference circuitry that memory device 200A can use to determine information (e.g., sense the states) stored in the other memory elements 221, 222, and 223 during a memory operation (e.g., a read operation).

FIG. 2A shows memory device 200A including four data lines as an example; the number of data lines can vary. For example, memory device 200A can include hundreds or thousands of data lines.

Memory device 200A can include circuits 251, 252, and 253 coupled to data lines 241, 242, and 243, respectively. Each of circuits 251, 252, and 253 can include a voltage comparator. Circuits 251, 252, and 253 can be included as part of sense circuitry (e.g., sense amplifiers) of a memory device 220A. During a read operation, memory device 200A can cause a current $I_{REF}$ (e.g., reference current) to flow through signal paths 261, 262, 263, and 264 to develop signals $V_{BLref}$, $V_{BL1}$, $V_{BL2}$, and $V_{BL3}$ on corresponding data lines 241, 242, 243, and 244. Signal $V_{BLref}$ can be used as a reference signal (e.g., a reference voltage signal). Based on signal $V_{BLref}$ and a respective signal $V_{BL1}$, $V_{BL2}$, and $V_{BL3}$, circuits 251, 252, and 253 can generate corresponding signals (e.g., sense output signals) $SD_{OUT1}$, $SD_{OUT2}$, and $SD_{OUT3}$ to indicate the states of corresponding memory elements 221, 222, and 223. As shown in FIG. 2A, circuits 251, 252, and 253 can include output nodes 254, 255 and 256 to provide signal $SD_{OUT1}$, $SD_{OUT2}$, and $SD_{OUT3}$, respectively. Each of signals $SD_{OUT1}$, $SD_{OUT2}$, and $SD_{OUT3}$ can have different levels (e.g., levels 257 and 258) to indicate different states of a corresponding memory element. The levels of the signals $SD_{OUT1}$, $SD_{OUT2}$, and $SD_{OUT3}$ can correspond to digital levels (e.g., levels corresponding to a binary 0 value or a binary 1 value).

During a read operation, circuit 251 can sample a voltage at node 274 (coupled to data line 244) provided by signal $V_{BLref}$ and compare it with a voltage at node 271 (coupled to data line 241) provided by signal $V_{BL1}$. Based on the values of the voltages at nodes 271 and 274, circuit 251 can generate signal $SD_{OUT1}$ with an appropriate signal level. For example, signal $SD_{OUT1}$ can have level 257 when the voltage at node 271 is less than the voltage at node 274. Signal $SD_{OUT1}$ can have level 258 when the voltage at node 271 is greater than the voltage at node 274. Different levels of signal $SD_{OUT1}$ can be used to indicate different states of memory element 221. For example, one level of signal $SD_{OUT1}$ can be used to indicate that memory element 221 has one state and another level of signal $SD_{OUT1}$ can be used to indicate that memory element 221 has another state.

Circuits 252 and 253 can operate in a fashion similar to that of circuit 251 during a memory operation. For example, circuit 252 can sample a voltage at node 274 and compare it with a voltage at node 272 (coupled to data line 242) provided by signal $V_{BL2}$ to generate signal SDout2. Different levels of signal $SD_{OUT2}$ can be used to indicate different states of memory element 222.

Circuit 253 can sample a voltage at node 274 and compare it with a voltage a voltage at node 273 (coupled to data line 243) provided by signal $V_{BL3}$ to generate signal SDout3. Different levels of signal $SD_{OUT3}$ can be used to indicate different states of memory element 223.

The value of the voltage at node 271 provided by signal $V_{BL1}$ during a read operation can depend on the state of memory element 221. Different states of memory element 221 can cause the voltage at node 271 to have different values. For example, a state (e.g., reset state) having a higher resistance value can cause the voltage at node 271 to have a higher value. A state (e.g., set state) having lower resistance value can cause the voltage at node 271 to have a lower value. Similarly, the value of the voltage at node 272 provided by signal $V_{BL2}$ depends on the state of memory element 222. The value of the voltage at node 273 provided by signal $V_{BL3}$ depends on the state of memory element 223.

The value of the voltage at node 274 provided by signal $V_{BLref}$ can be selected such that the voltage at node 274 can be used as a reference voltage to determine the states of memory elements 221, 222, and 223 in a read operation. For example, the value of the voltage at node 274 can be selected to be between lowest and highest expected values of the voltages at nodes 271, 272, and 273 associated with different states (e.g. set and resets) of memory elements 221, 222, and 223. Based on this reference voltage and the voltages at nodes 271, 272, and 273, the states of memory elements can be determined (e.g., by a voltage comparisons), as described above.

As shown in FIG. 2A, voltage at node 274 can be the sum of a voltage source V1, a voltage across memory element 224, the base-to-emitter voltage (e.g., Vbe) of the bipolar junction transistor, and the voltage on access line 236 (provided by signal $V_{WL}$). Memory element 224 can be configured to be in the same state (e.g., a fixed state, such as a fixed set state) so that the voltage across memory element 224 during a read operation can be a known voltage (e.g., a predetermined voltage). The voltage provided by signal $V_{WL}$ to access line 236 can be zero volts plus an additional voltage (e.g., increased voltage) due to parasitic resistance associated with memory cells coupled to the access line. However, such an additional voltage can be common between signal path 264 (e.g., reference signal path) and each of signal paths 261, 262, and 263. Therefore, such an additional voltage may be ignored from the calculation for a reference voltage. Thus, by selecting an appropriate value for voltage source V1, the voltage at node 274 can also be appropriately selected as a reference voltage during a read operation.

As an example, if a voltage at node 271 is expected to be 1.1V (volt) when memory element 221 is in a lower resistance state (e.g., a set state) and 1.5V volts when memory element 221 is in a higher resistance state (e.g., a reset state), then the value of voltage source V1 can be selected such that the voltage at node 274 is about 1.3V (which is between 1.1V and 1.5V).

As shown in FIG. 2A, memory device 200A can include transistors 281, 282, and 283 that can be controlled by a signal $V_{CLAMP}$. As described above, memory device 200A can cause current $I_{REF}$ to flow through memory elements 221, 222, and 223 during a read operation. In some cases, the voltage across memory cells 211, 212, and 213 may exceed a safe operating condition of memory cells 211, 212, and 213 when their respective memory elements 221, 222, and 223 are in a certain state (e.g., a reset state). Transistors 281, 282, and 283 can be controlled such that a maximum voltage from memory elements 221, 222, and 223 (e.g., in a reset state) can be clamped at a certain value. This may keep the current through memory elements 221, 222, and 223 at a safe level to avoid disturbance that may happen to memory cells 211, 212, and 213 during a read operation of memory device 200A. For example, an appropriate value for voltage source V2 can be selected to turn on transistors 281, 282, and 283 to clamp the voltages at nodes 271, 272, and 273 at a certain value.

Memory device 200A can include a generator 296 to generate current $I_{REF}$. Generator 296 can include transistor 295 that can be arranged (e.g., in a current mirror arrangement) with each of transistors 291, 292, 293, and 294 to cause current $I_{REF}$ to flow through each of memory elements 221, 222, 223, and 224 in a memory operation (e.g., a read operation).

FIG. 2A shows a one-to-one association between memory cells 211, 212, and 213 and circuits 251, 252, and 253 as an example. However, in an alternative arrangement, each of circuits 251, 252, and 253 can be associated with multiple memory cells (e.g. 128 memory cells). In such an alternative arrangement, a selector circuit (e.g., multiplexer, such as a local column decoder) can be used to select a data line associated with a selected memory cell from the multiple memory cells. Then, circuits 251, 252, and 253 can be used to determine the states of the selected memory cells based on a reference voltage from respective selected data lines, as described above.

Using a reference voltage provided by signal $V_{BLref}$ as described above may improve the accuracy of determining the states of memory elements 221, 222, and 223 during a memory operation (e.g., a read operation) of memory device 200A. For example, as the fabricating process shrinks, accurately determining the states of memory elements (e.g., 221, 222, and 223) in the memory device, such as memory device 200A, may become a challenge due to various factors. One of the factors may include an increase in the value of the voltage associated with the access line (e.g., access line 236) and driver (e.g., driver 238). The increase in the value of such voltage may contribute to a reduced gain of bipolar junction transistors in select components 231, 232, 233, and 234 such that they may become diodes during a read operation. Thus, most of the current (e.g., most of $I_{REF}$) may flow to access line 236. Another factor may include a relatively higher access line resistance and driver parasitic resistance due to a reduced size of the driver to match shrinking dimensions (e.g., pitch) between features in the memory array. Other factors may include the voltage on access lines being dependent on the states of memory elements (e.g., 221, 222, and 223) of the selected memory cells (e.g., 211, 212, and 213). These factors may make it a challenge to apply compensation (e.g., apply global compensation) to reduce these effects, such as the increase in voltage on the access line during a read operation.

In memory device 200A, using a reference voltage provided by signal $V_{BLref}$ as described above may compensate for the effects mentioned above, including the increase in voltage on the access line (e.g., access line 236). The compensation may improve accuracy in determining the states of memory elements 221, 222, and 223 during a memory operation (e.g., a read operation) of memory device 200A. The compensation for the increase in voltage on the access line can be done locally at the array level. For example, as described above, the same voltage (provided by signal $V_{WL}$) on access line 236 can be used to form part of the reference voltage at node 274 coupled to data line 244. Thus, the state dependent voltage on access line 236 can become a common mode signal between signal path 264 (e.g., reference signal path) and each of signal paths 261, 262, and 263. Therefore, the increase in the voltage on access line 236 may no longer affect part of a read operation (e.g., sensing stage) in determining the states of memory elements 221, 222, and 223. Further, by using a reference voltage provided by signal $V_{BLref}$ as described above, no additional reference current may be needed. The current flowing to memory elements 221, 222, 223, and 224 can be independent of the resistance values (e.g., states) of elements 221, 222, 223, and 224.

Figure 2B:
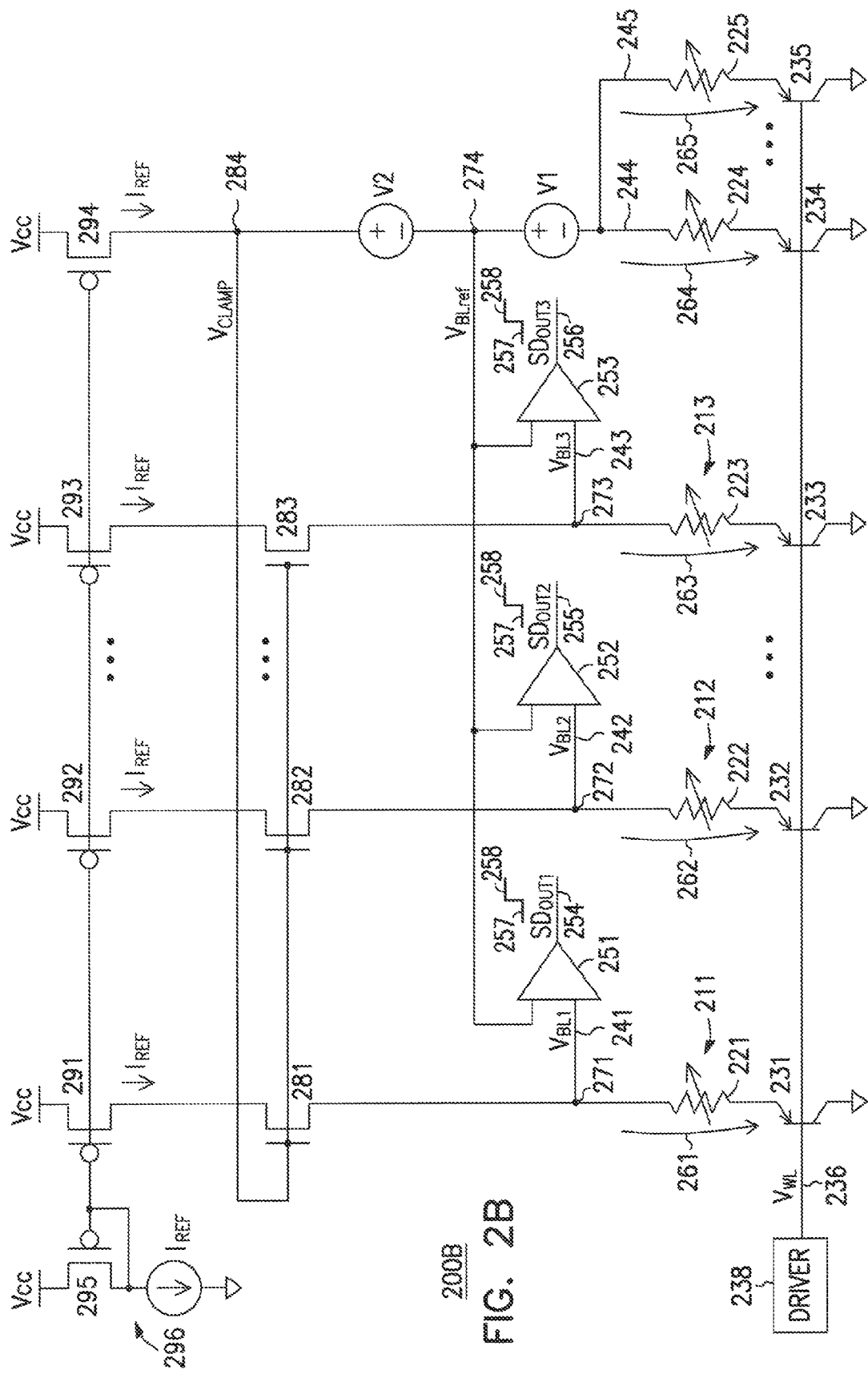
FIG. 2B shows a schematic diagram of a portion of a memory device having multiple reference signal paths, according to an embodiment of the invention.

FIG. 2B shows a schematic diagram of a portion of a memory device 200B having multiple reference signal paths, according to an embodiment of the invention. Memory device 200B includes features similar to or identical to those of memory device 200A. Thus, the description of similar or identical features between memory devices 200A and 200B is not repeated in the description of FIG. 2B.

As shown in FIG. 2B, memory device 200B can include a reference line 245, memory element 225, and a select component 235, forming part of a signal path 265. Memory element 225 can share access line 236 with memory elements 221, 222, 223, and 224. Memory elements 221 through 225 can be located in the same memory array of memory device 200B. Memory elements 221 through 225 can be physically arranged in the same row (or same column) in the memory array of memory device 200B. Data lines 241 through 245 can extend in the same direction and can be located in the same memory array of memory device 200B.

Signal paths 264 and 265 can be parallel with each other. Memory device 200B can use memory elements 224 and 225 as reference memory elements and data lines 244 and 245 reference data lines. Signal paths 264 and 265 can be used as multiple reference signal paths in memory device 200B. FIG. 2B shows an example of two reference signal paths and two reference data lines as an example; the number of reference signal paths and reference data lines can vary.

The voltage at node 274 provided by signal $V_{BLref}$ can be the same as that in memory device 200A (FIG. 2A). However, in FIG. 2B, signal $V_{BLref}$ that provides the voltage at node 274 can be developed from a parallel combination of signal paths 264 and 265. Providing multiple reference signal paths (e.g., 264 and 265) in parallel may reduce variation (e.g., by averaging resistance variation) among the reference memory elements (e.g., 224 and 225) and associated bipolar transistors (e.g., 234 and 235). This may further enhance the compensation for the increase in the voltage on access line 236, as described above with reference to FIG. 2A. Providing multiple reference signal paths may also reduce the impact of a bad (e.g., defective) reference signal path (e.g., 264 or 265) and associated reference data line (e.g., 244 or 245).

Figure 3A:
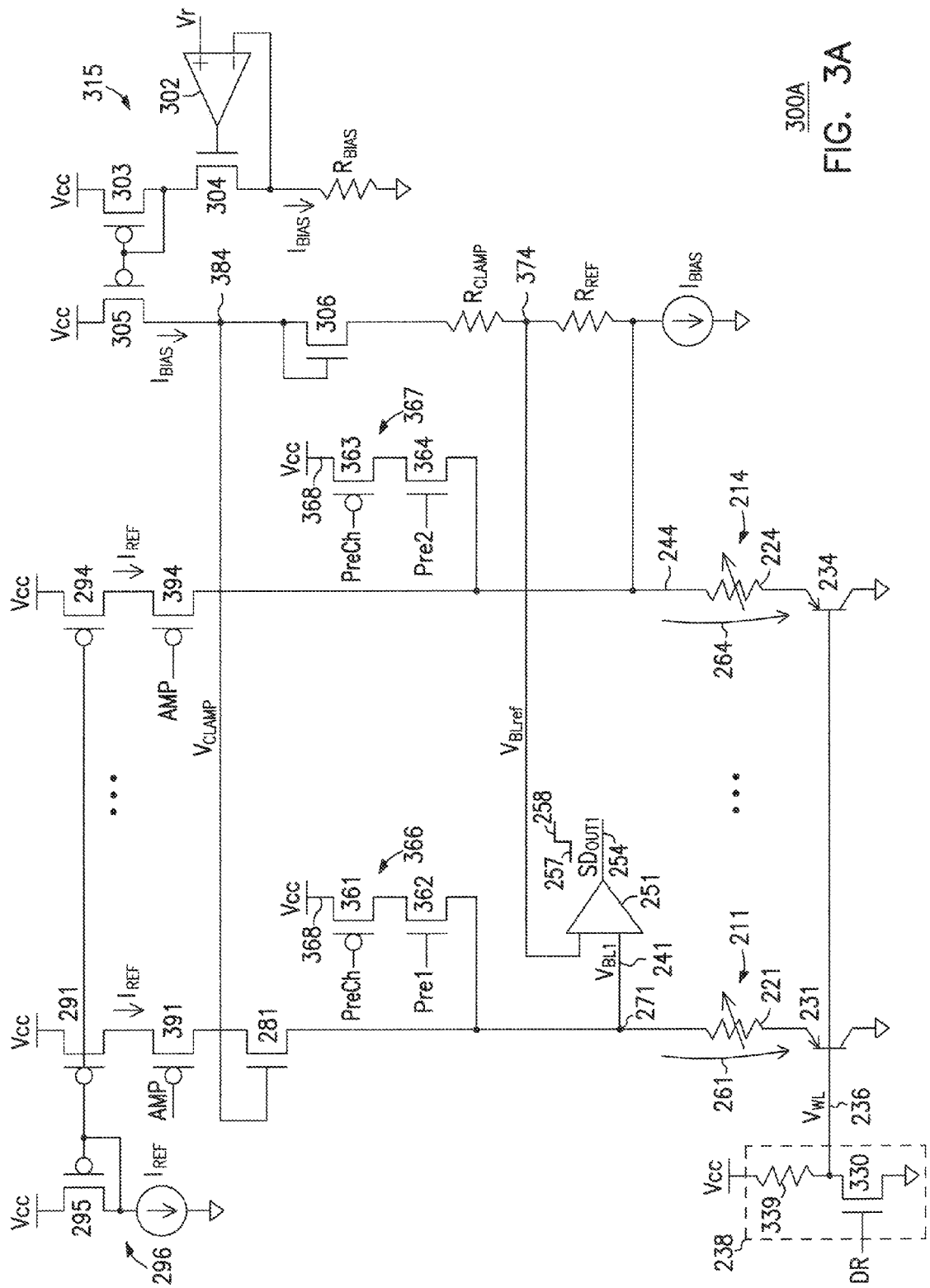
FIG. 3A shows a schematic diagram of a portion of a memory device having circuitry to generate signals including a reference signal, according to an embodiment of the invention.

FIG. 3A shows a schematic diagram of a portion of a memory device 300A having circuitry to generate signals $V_{BLref}$ and $V_{CLAMP}$, according to an embodiment of the invention. Memory device 300A can include features similar to or identical to those of memory device 200A. Thus, the description of similar or identical features between memory devices 200A and 300A is not repeated in the description of FIG. 3A. For simplicity, FIG. 3A shows only two memory elements (e.g., 221 and 224). Memory device 300A can include numerous memory elements similar to or identical to those of memory device 200A. FIG. 3A shows only circuit 251 for simplicity. Memory device 300A can include other circuits similar to circuit 251 (e.g., circuit 252 and 253 in FIG. 2A).

As shown in FIG. 3A, driver 238 may include a transistor 330 and a resistance (e.g., a resistor) 339 coupled to access line 236 and a voltage supply node, such as Vcc. A signal DR can be activated to turn on transistor 330 during a read operation if a memory cell (e.g., 221) associated with access line 236 is selected. Signal DR can be deactivated to turn off transistor 330 during a read operation if no memory cells associated with access line 236 are selected. During a read operation, if one of the memory cells associated with access line 236 is selected, most of the current (most of $I_{REF}$) from signal paths 261 and 264 may flow to access line 236 and then to ground through transistor 330. Thus, each of signal paths 261 and 264 can include a segment through a respective memory element (e.g., 221 or 224), at least part of a respective select component (e.g., 231 or 234), at least part of access line 236, and transistor 330.

Memory device 300A can include a generator 315 to generate a current (e.g., bias current) $I_{BIAS}$. Generator 315 can be an on-die generator such that it can be formed on the same die with memory cells (e.g., memory cells 221 and 224) of memory device 300A. Memory device 300A can use current $I_{BIAS}$ to generate voltages at nodes 374 and 384 associated with signals $V_{BLref}$ and $V_{CLAMP}$, respectively. The voltages at nodes 374 and 384 can correspond to the voltages at nodes 274 and 284, respectively, of FIG. 2A. Signals $V_{BLref}$ and $V_{CLAMP}$ can be used in a read operation of memory device 300A that can be similar to or identical to the read operation of memory device 200A of FIG. 2A. For example, the voltage at node 374 provided by signal $V_{BLref}$ can be used as a reference voltage during a read operation to determine the states of memory elements (e.g., 221) of memory device 300A. The voltage at node 384 provided by signal $V_{CLAMP}$ can be used during a read operation to avoid disturbance that may happen to memory cells of memory device 300A.

Generator 315 can include an amplifier 302, transistors 303 and 304, and a resistance (e.g., a resistor) $R_{BIAS}$. Amplifier 302 and transistor 304 can form a unity gain operational amplifier. Generator 315 can generate current $I_{BIAS}$, such that $I_{BIAS}=Vr/R1$. Voltage Vr can be generated from a bandgap voltage (not shown) of memory device 300A. Generator 315 can be part of such bandgap circuitry (not shown) of memory device 300A, such that the values of voltage Vr can remain substantially constant across different operating voltages and temperatures of memory device 300A.

Memory device 300A can include transistor 305, which can be arranged (e.g., in a current mirror arrangement) with transistor 303 to cause current $I_{BIAS}$ to flow through transistor 305. Then, current $I_{BIAS}$ can flow through a transistor 306 and resistances (e.g., resistors) $R_{CLAMP}$ and $R_{REF}$ to generate the voltages at nodes 374 and 384. Transistor 306 can be configured to operate as a diode. Transistors 306 and 281 can be structured (e.g., be a same size) so that their current density can be the same. The voltage across resistance $R_{REF}$ can correspond to voltage source V1 in FIG. 2A. The voltage across transistor 306 and resistance $R_{CLAMP}$ can correspond to voltage source V2 in FIG. 2A. Resistances $R_{REF}$ and $R_{CLAMP}$ can have the same resistance type as that of resistances $R_{BIAS}$. Since voltage Vr can remain substantially constant across different operating voltages and temperatures of memory device 300A, the value of the voltage across resistances $R_{CLAMP}$ and $R_{REF}$ can also remain substantially constant across different operating voltages and temperatures of memory device 300A.

In FIG. 3A, the voltage at node 374 provided by signal $V_{BLref}$ can be calculated based on current $I_{BIAS}$ as shown in the following equation (1).

$$V_{BLref} = V_{WL} + Vbe + (I_{BIAS} * R_{REF})$$

$$V_{BLref} = V_{WL} + Vbe + (R_{REF}/R_{BIAS}) * Vr \quad (1)$$

In equation (1), voltage Vbe represents the base-to-emitter voltage of the bipolar junction transistor. Memory element 224 can be configured (e.g., programmed to set state), such that the voltage across memory element 224 can be assumed to be zero or near zero. In equation (1), the voltage represented by $(R_{REF}/R_{BIAS}) * Vr$ can correspond to voltage source V1 of FIG. 2A.

In FIG. 3A, the voltage at node 384 provided by signal $V_{CLAMP}$ can be calculated based on current $I_{BIAS}$ as shown in the following equation (2).

$$V_{CLAMP} = V_{WL} + Vbe + (R_{REF} + R_{CLAMP}) * I_{BIAS} + Vgs$$

$$V_{CLAMP} = V_{WL} + Vbe + [((R_{REF} + R_{CLAMP})/R_{BIAS}) * Vr] + Vgs \quad (2)$$

In equation (2), voltage Vgs represents the gate-to-source voltage of transistor 306. The term $((R_{REF}+R_{CLAMP})/R_{BIAS})*Vr$ can be rewritten as $(R_{REF}/R_{BIAS})*Vr+(R_{CLAMP}/R_{BIAS})*Vr$. Thus equation (2) can be rewritten as the following equation (3).

$$V_{CLAMP} = V_{WL} + Vbe + (R_{REF}/R_{BIAS}) * Vr + (R_{CLAMP}/R_{BIAS}) * Vr + Vgs \quad (3)$$

In equation (3), the voltage represented by $(R_{CLAMP}/R_{BIAS})*Vr+Vgs$ can correspond to voltage source V2 of FIG. 2A.

As shown in FIG. 3A, memory device 300A can include transistors 361, 362, 363, 364, 391, and 394. Transistors 361 and 362 can form part of a circuit (e.g., precharge circuit) 366 to precharge data line 241 (e.g., normal data line) during a time interval in a read operation. Transistors 363 and 364 can form part of a circuit (e.g., precharge circuit) 367 to precharge data line 244 (e.g., reference data line) during a time interval in a read operation. Transistor 391 can form part of a circuit (e.g., amplification circuit) to allow current $I_{REF}$ to flow through signal path 261 and develop signal $V_{BL1}$. Transistor 394 can form part of a circuit (e.g., amplification circuit) to allow current $I_{REF}$ to flow through signal path 264 develop signal $V_{BLref}$.

A read operation of memory device 300A can include different stages that can be performed in a sequential order, such as the following sequential order: a decoding stage, a precharge stage, an amplification stage, and a sense (e.g., comparison) stage.

The decoding stage can be performed by decoding circuitry (not shown) of memory device 300A that can be similar to row decoder 106 and column decoder 107 of FIG. 1. The decoding stage can select which memory cells associated with an access line (e.g., access line 236) are to be accessed in order to determine information stored in memory elements of the selected memory cells.

The precharge stage may increase the speed of the read operation in memory device 300A. During the precharge stage, transistor 391 can be turned off, such as by deactivating signal AMP. Circuits 366 and 367 can couple data lines 241 and 244, respectively, to a supply node 368, which can be provided with a voltage (e.g., a precharge voltage, such as Vcc). For example, during the precharge stage, circuit 361 can activate signals PreCh and Pre1 to turn on transistors 361 and 362 and couple data line 241 to supply node 368 (via a path through transistors 361 and 362). Data line 241 can be coupled to supply node 368 for a time interval (e.g., a precharge time interval) before signal $SD_{OUT1}$ is generated. After the time interval (e.g., at or near the end of the precharge time interval) which is when the voltages on data lines 241 and 244 reach a certain value (e.g., a predetermined value) and before signal $SD_{OUT1}$ is generated, circuit 361 can deactivate signals PreCh to turn off transistor 361 and decouple data line 241 from supply node 368.

Similarly, during the precharge stage, circuit 367 can turn on transistors 363 and 364 and couple data line 244 (e.g., reference data line) to supply node 368 (via a path through transistors 363 and 364) for a time interval (e.g., a precharge time interval). Then, circuit 367 can decouple data line 244 from supply node 368 after the time interval (e.g., at or near the end of the precharge time interval). Decoupling data line 244 from supply node 368 can include turning off transistor 363.

The voltage provided by signal Pre1 can be greater than the voltage provided by signal Pre2 to reduce or prevent disturbance that may happen to memory cells during the precharge state.

The amplification stage of a read operation of memory device 300A can be performed following the precharge stage. During the amplification stage, signal AMP can be activated, such that transistors 391 and 394 can be turned on. This can cause current $I_{REF}$ to flow through transistors 391 and 394 and then through memory elements 221 and 224 to develop signal $V_{BL1}$ and $V_{BLref}$, respectively.

The sense stage of a read operation of memory device 300A can be performed following the amplification stage. The sense stage can be performed to determine the states of memory elements of the selected memory cells, so that corresponding values of information stored in memory elements of the selected memory cells can be read. The sense stage can be performed by circuit 251 and other similar circuits (such as 252, and 253 in FIG. 2A) as described above with reference to FIG. 2A.

Figure 3B:
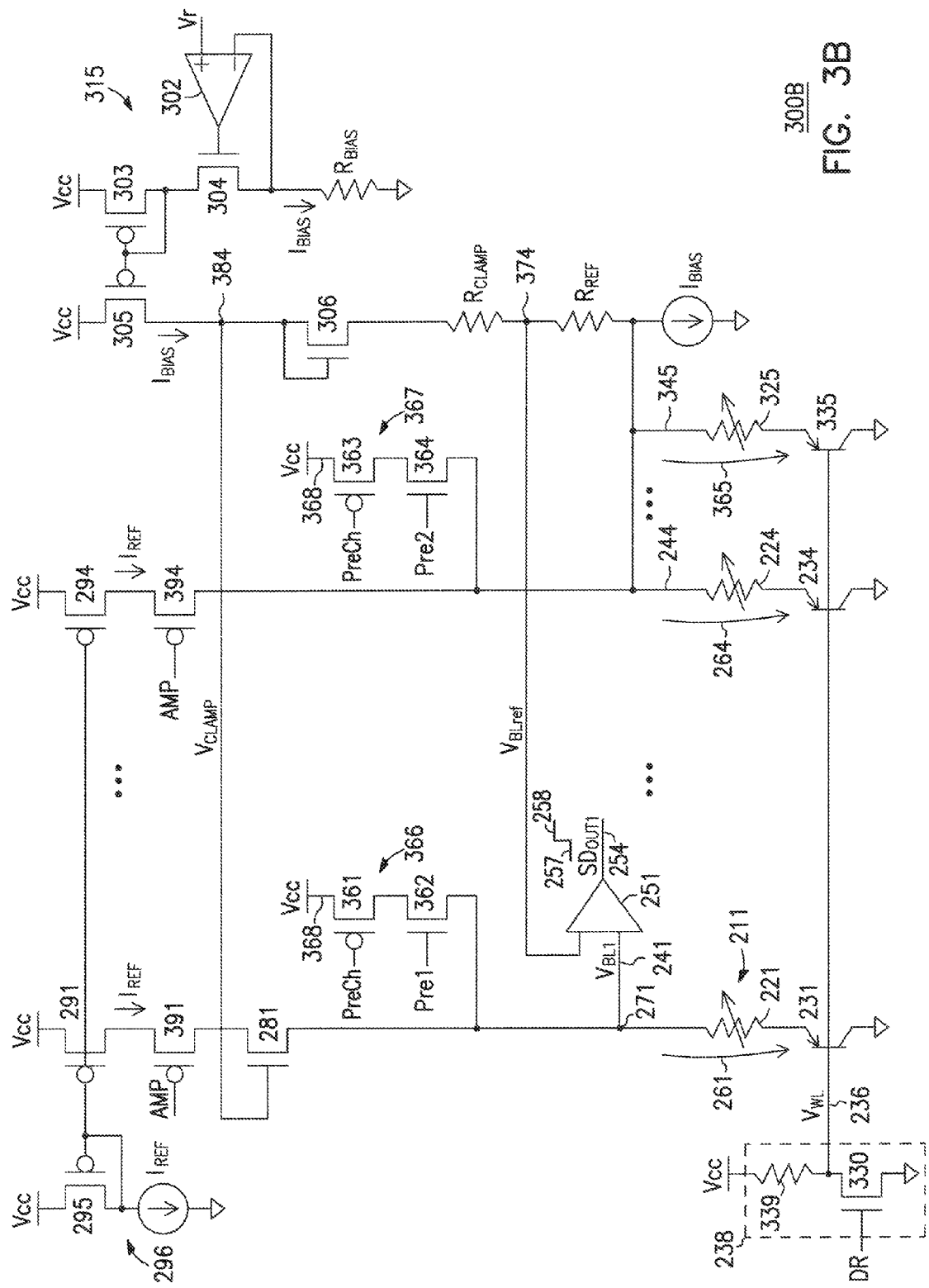
FIG. 3B shows a schematic diagram of a portion of a memory device having multiple reference signal paths and circuitry to generate signals including a reference signal, according to an embodiment of the invention.

FIG. 3B shows a schematic diagram of a portion of a memory device 300B having multiple reference signal paths, according to an embodiment of the invention. Memory device 300B includes features similar to or identical to those of memory device 300A. Thus, the description of similar or identical features between memory devices 300A and 300B is not repeated in the description of FIG. 3B.

As shown in FIG. 3B, memory device 300B can include multiple signal paths 264 and 365 that can be used as multiple reference signal paths. The voltage at node 374 provided by signal $V_{BLref}$ can be the same as that in memory device 300A (FIG. 2A). Multiple reference signal paths (e.g., 264 and 365) in parallel may enhance compensation in memory device 300B, similar to that described above with reference to FIG. 2A.

As shown in FIG. 3B, memory device 300B can include a data line 345, memory element 325, and a select component 335, forming part of a signal path 365. Memory element 325 can share access line 236 with memory elements 221 and 224. Memory elements 221, 224, and 325 can be located in the same memory array of memory device 300B. Memory elements 221, 224, and 325 can be physically arranged in the same row (or same column) in the memory array of memory device 300B. Data lines 241, 244, and 345 can extend in the same direction and can be located in the same memory array of memory device 300B.

Signal paths 264 and 365 can be parallel with each other. Memory device 300B can use memory elements 224 and 325 as reference memory elements and data lines 244 and 345 as reference data lines. Signal paths 264 and 365 can be used as multiple reference signal paths in memory device 300B. FIG. 3B shows an example of two reference signal paths and two reference data lines as an example; the number of reference signal paths and reference data lines can vary.

The voltage at node 374 provided by signal $V_{BLref}$ can be the same as that in memory device 300A (FIG. 2A). However, in FIG. 3B, signal $V_{BLref}$ that provides the voltage at node 374 can be developed from a parallel combination of signal paths 264 and 365. Providing multiple reference signal paths (e.g., 264 and 365) in parallel may reduce variation (e.g., by averaging resistance variation) among the reference memory elements (e.g., 224 and 325) and associated bipolar transistors (e.g., 234 and 335). This may further enhance the compensation for the increase in the voltage on access line 236, as described above with reference to FIG. 2A. Providing multiple reference signal paths may also reduce the impact of a bad (e.g., defective) reference signal path (e.g., 264 or 365) and associated reference data line (e.g., 244 or 345).

Figure 4A:
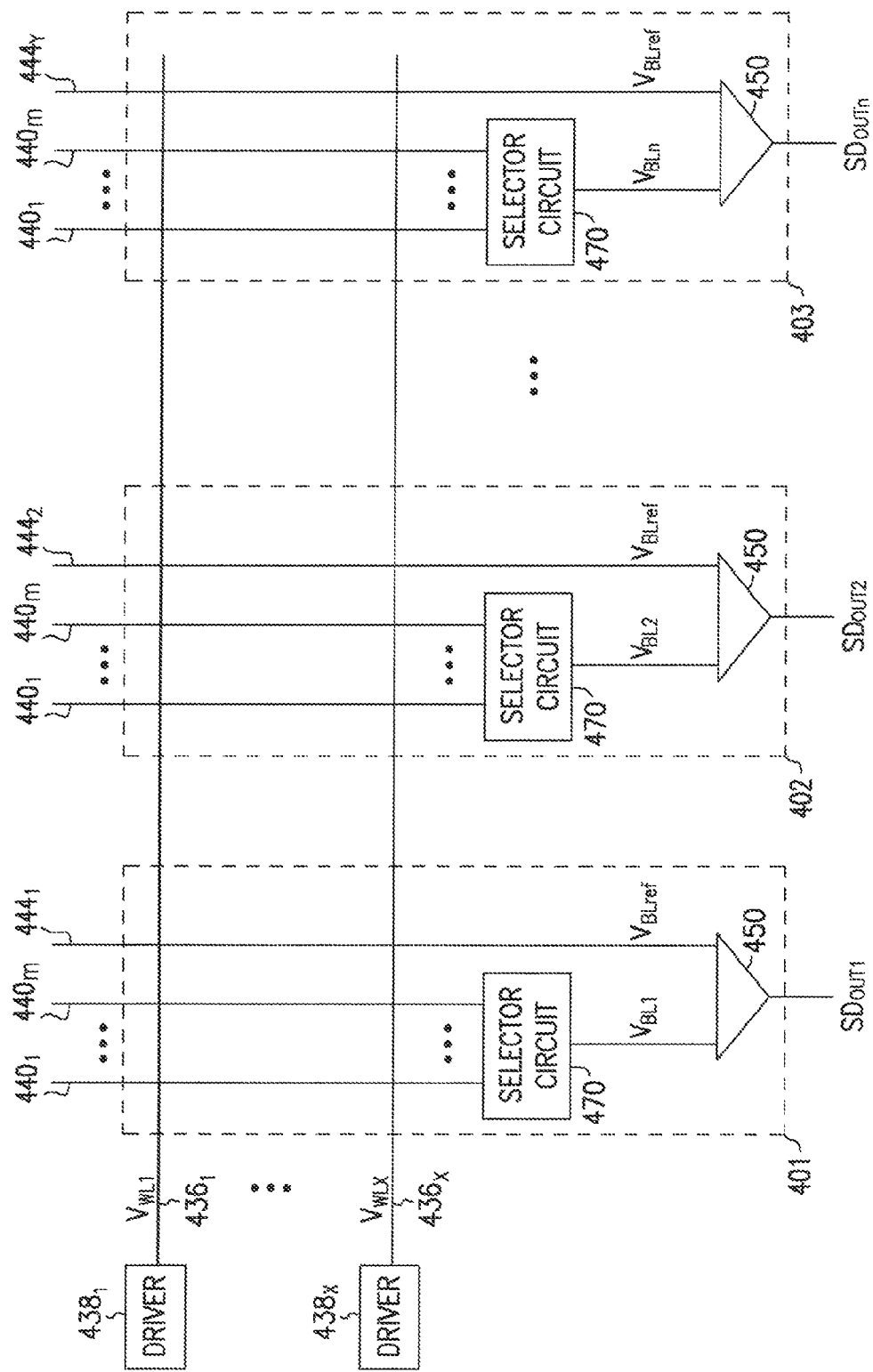
FIG. 4A shows a schematic diagram of a portion of a memory device having multiple memory portions of memory cells, according to an embodiment of the invention.

FIG. 4A shows a schematic diagram of a portion of a memory device 400A having multiple memory portions 401, 402, and 403 of memory cells, according to an embodiment of the invention. Each of memory portions 401, 402, and 403 can include multiple memory cells (not shown) having memory elements, and select components having bipolar junction transistors. For simplicity, FIG. 4A does not show memory elements and bipolar junction transistors. However, the memory elements and bipolar junction transistors of memory device 400A can be similar or identical to those of the memory devices of FIG. 2A through FIG. 3B.

In FIG. 4A, at least part of memory portions 401, 402, and 403 can form a memory group (e.g., memory tile) of memory cells. FIG. 4A shows three memory portions (401, 402, and 403) of memory cells as an example; the number of memory portions may vary. Thus, memory device 400A can include multiple memory groups in which each of the multiple memory groups can include multiple memory portions similar to memory portions 401, 402, and 403. The multiple memory groups can have select components (e.g., BJTs) that can share the same access lines $436_1$ and $436_X$.

As shown in FIG. 4A, each of memory portions 401, 402, and 403 can include multiple data lines $440_1$ through $440_m$, a selector circuit (e.g., multiplexer) 470, and a circuit (e.g., voltage comparator) 450. Memory device 400A can also include data lines $444_1$, $444_2$, and $444_Y$ associated with respective memory portions 401, 402, and 403. Data lines $440_1$ through $440_m$, $444_1$, $444_2$, and $444_Y$ can be structured as a group of data lines that can physically extend in the same direction. Memory device 400A can use data lines $444_1$, $444_2$, and $444_Y$ as reference data lines, similar to that of data line 244 of FIG. 2A and FIG. 3A. FIG. 4A shows each of memory portions 401, 402, and 403 including one reference data line (e.g., one of $444_1$, $444_2$, and $444_Y$) as an example. However, each of memory portions 401, 402, and 403 can have multiple parallel reference data lines.

Memory device 400A can include access lines (e.g., word lines) $436_1$ through $436_X$ and drivers $438_1$ through $438_X$ to apply signals $V_{WL1}$ and $V_{WLX}$, respectively, to access lines $436_1$ through $436_X$. Each of drivers $438_1$ through $438_X$ can correspond to driver 238 of FIG. 2A through FIG. 3B. Each of access lines $436_1$ through $436_X$ can correspond to access line 236 of FIG. 2A through FIG. 3B. Thus, each of access lines $436_1$ through $436_X$ can be shared by select components (e.g., BJTs) in memory portions 401, 402, and 403. Memory device 400A can generate signals $V_{BLref}$, $V_{BL1}$, $V_{BL2}$, and $V_{BLn}$ and signals $SD_{OUT1}$, $SD_{OUT2}$, and $SD_{OUT3}$ that can correspond to those of FIG. 2A through FIG. 3B.

In a read operation of memory device 400A, selector circuit 470 in each of memory portions 401, 402, and 403 can select a data line among data lines $440_1$ through $440m$ within its memory portion. The selected data line can be associated with a selected memory cell where stored information is to be determined. Then, circuit 450 in each of memory portions 401, 402, and 403 can compare a voltage provided by the respective selected data line with a voltage provided by signal $V_{BLref}$ associated with a reference data line in a respective memory portion among memory portions 401, 402, and 403. The result of the comparison can indicate the state of the memory element of the selected memory cell in each of memory portions 401, 402, and 403.

For example, selector circuit 470 and comparator 450 in memory portions 401 can operate similarly or identically to circuit 251 to compare the voltages associated with signals $V_{BLref}$ and $V_{BL1}$ to generate signal $SD_{OUT1}$. The level of signal $SD_{OUT1}$ indicates the state of the memory element of the selected memory cell in memory portion 401. Selector circuit 470 and comparator 450 in memory portions 402 can operate similarly or identically to circuit 253 to compare the voltages associated with signals $V_{BLref}$ and $V_{BL2}$ to generate signal $SD_{OUT1}$. The level of signal $SD_{OUT2}$ indicates the state of the memory element of the selected memory cell in memory portion 402. Selector circuit 470 and comparator 450 in memory portion 403 can operate similarly or identically to circuit 253 to compare the voltages associated with signals $V_{BLref}$ and $V_{BLn}$ to generate signal $SD_{OUTn}$. The level of signal $SD_{OUTn}$ indicates the state of the memory element of the selected memory cell in memory portion 403.

Using a reference voltage provided by signal $V_{BLref}$ as described above with reference to FIG. 4A also makes voltages across the bipolar junction transistors in memory portions 401, 402, and 403, data lines $440_1$ through $440_m$, and selector circuit 470 a common mode signal between reference signal paths (e.g., associated with reference data lines $444_1$, $444_2$, and $444_Y$). This may further enhance the compensation for the increase in the voltage on access line $436_1$ and $436_X$ during a read operation. The combination of the arrangement of memory portions 401, 402, and 403 and the compensation described herein may also allow higher sense bandwidth per memory group (e.g., memory tile) in memory device 400A. Thus, fewer memory groups (e.g., memory tiles) may be selected for a given read bandwidth. This may lead to lower read energy (e.g., lower transient power) used in a read operation in memory device 400A.

Figure 4B:
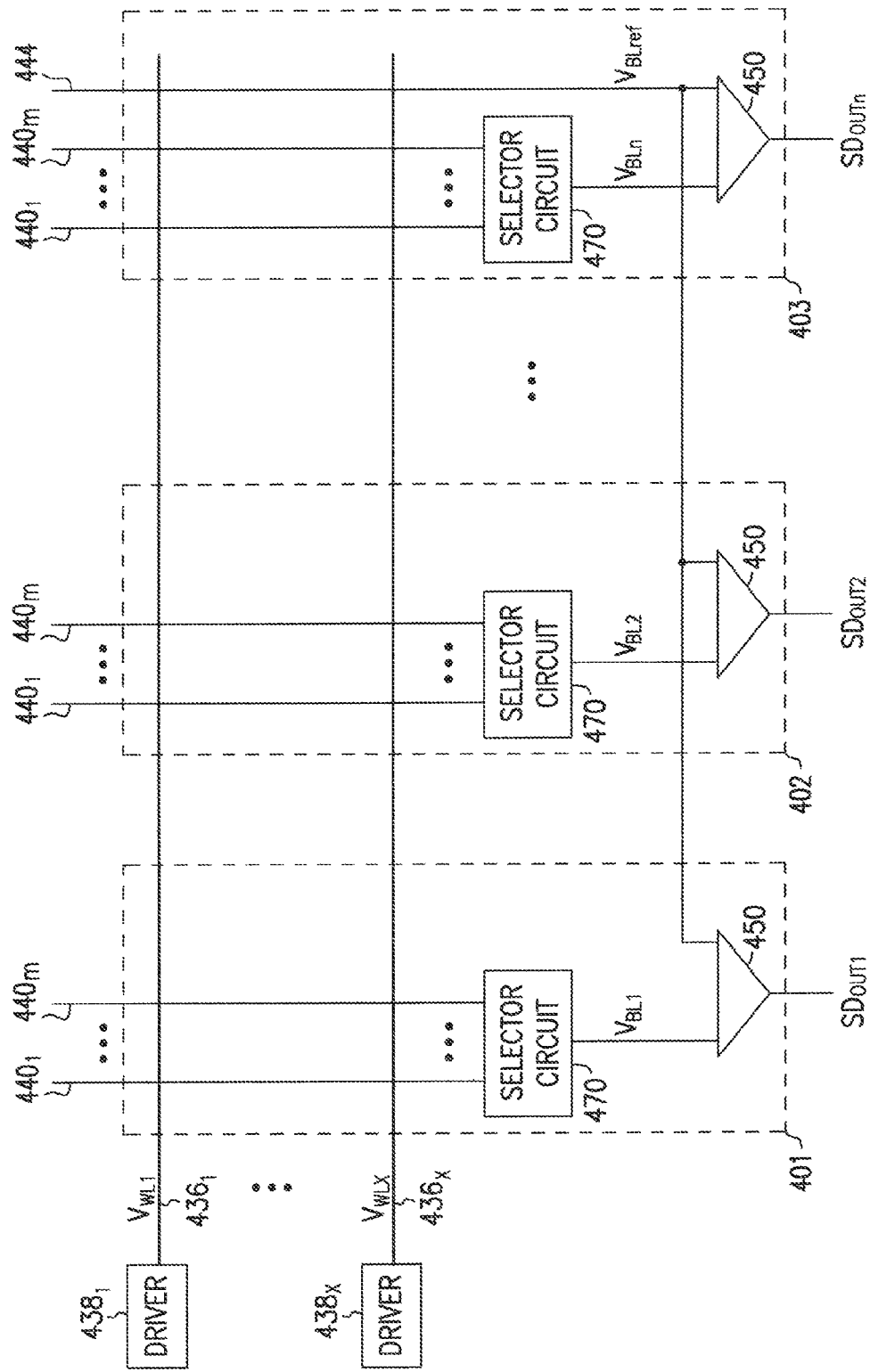
FIG. 4B shows a schematic diagram of a portion of a memory device having a reference data line associated with multiple memory portions, according to an embodiment of the invention.

FIG. 4B shows a schematic diagram of a portion of a memory device 400B with a data line 444 associated with multiple memory portions 401, 402, and 403, according to an embodiment of the invention. Memory device 400B includes features similar to or identical to those of memory device 400A. Thus, the description of similar or identical features between memory devices 400A and 400B is not repeated in the description of FIG. 4B.

As shown in FIG. 4B, a single data line 444 can be associated with memory portions 401, 402, and 403. Thus, a memory group of memory cells (e.g., the group formed by memory portions 401, 402, and 403) can share a single reference data line. FIG. 4B shows memory portions 401, 402, and 403 sharing the same reference data line 444 as an example. However, memory portions 401, 402, and 403 can share multiple parallel reference data lines.

Figure 5:
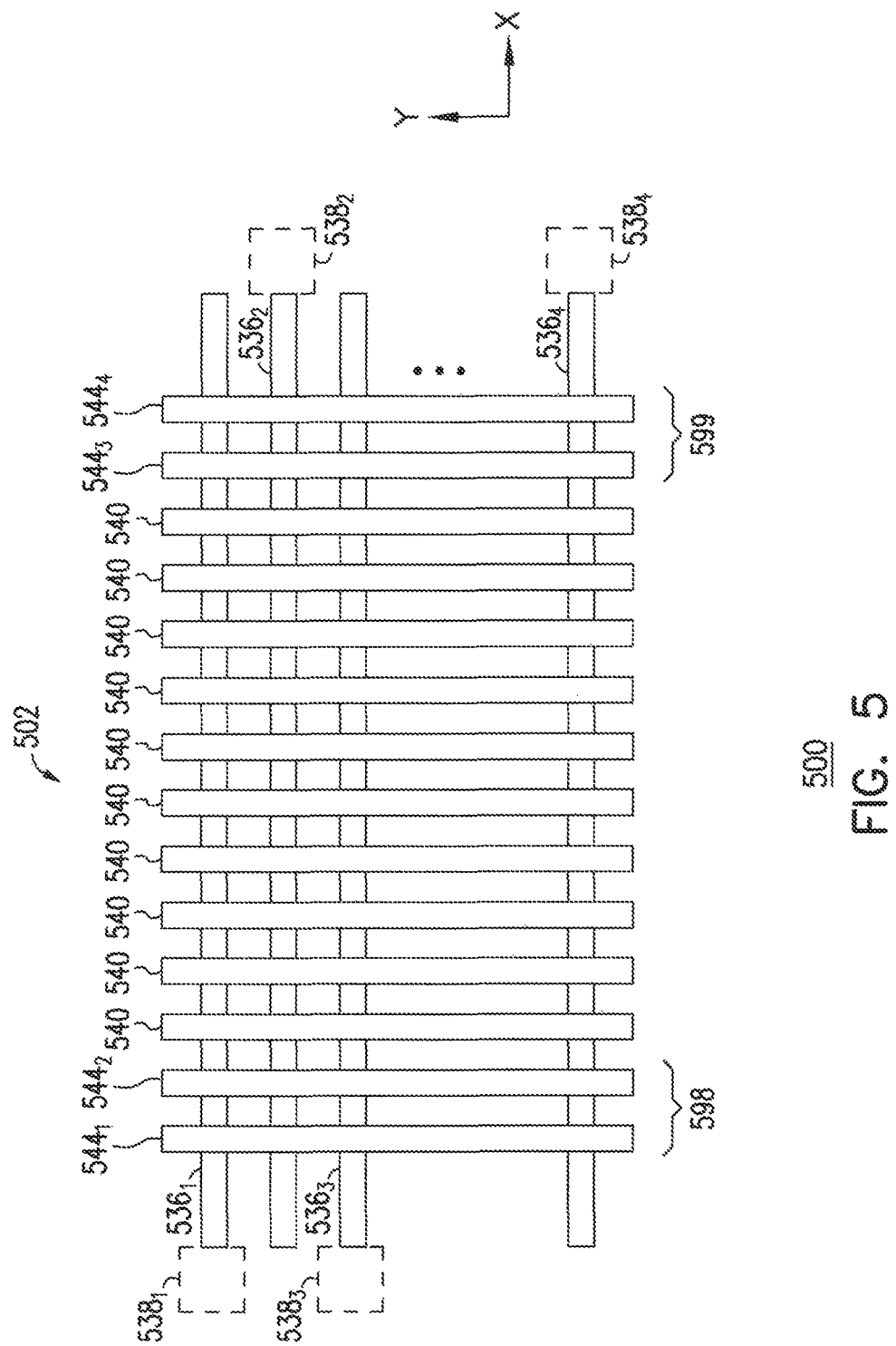
FIG. 5 shows a top view of a structure of a portion of a memory device having multiple data lines that can be used as reference data lines, according to an embodiment of the invention.

FIG. 5 shows a top view of a structure of a portion of a memory device 500 having multiple data lines $544_1$, $544_2$, $544_3$, and $544_4$ that can be used as reference data lines, according to an embodiment of the invention. Data lines $544_1$ and $544_2$ can be part of multiple parallel reference signal paths similar to data lines 244 and 245 of FIG. 2B or data lines 244 and 345 of FIG. 3B. Similarly, data lines $544_3$ and $544_4$ can be part of multiple parallel reference signal paths similar to data lines 244 and 245 of FIG. 2B or data lines 244 and 345 of FIG. 3B. Data lines $544_1$, $544_2$, $544_3$, and $544_4$ can be coupled to reference memory elements, which may not be used to store information in memory device 500. The reference memory elements may be configured to be in the same state (e.g., fixed state, such as a fixed set state) and may be used as parts of reference signal paths to generate reference voltage signals, such as signal $V_{BLref}$ described above in the description of FIG. 2A through FIG. 4B.

As shown in FIG. 5, memory device 500 can also include data lines 540 extending in the same direction (e.g., a y-direction) as data lines $544_1$, $544_2$, $544_3$, and $544_4$. Data lines 540 can correspond to data lines 241, 242, and 243 of FIG. 2A and FIG. 2B. Data lines 540 can be coupled to memory elements of memory cells, which can be used to store information in memory device 500.

Data lines 540 and data lines $544_1$, $544_2$, $544_3$, and $544_4$ can be structured as a group of conductive lines and can form as parts of conductive routings (e.g., part of bit line routings) in a memory array 502 of memory device 500. Memory array 502 can correspond to memory array 102 of FIG. 1. Memory array 502 can include areas 598 and 599 on different sides of memory array 502. Area 598 can include an edge (e.g., left edge) on one side of memory array 502. Area 599 can include another edge (e.g., right edge) on another side of memory array 502. FIG. 5 shows an example of two reference data lines (e.g., $544_1$ and $544_2$) located in area 598 and two reference data lines (e.g., $544_3$ and $544_4$) in area 599. The number of reference data lines located in each of areas 598 and 599 can vary.

As shown in FIG. 5, memory device 500 can include access lines $536_1$, $536_2$, $536_3$, and $536_4$ extending an x-direction, which can be perpendicular to the y-direction. Access lines $536_1$, $536_2$, $536_3$, and $536_4$ can be structured as conductive lines and can form as parts of conductive routings (e.g., part of word line routings) in a memory array 502 of memory device 500. Access lines $536_1$, $536_2$, $536_3$, and $536_4$ that can correspond to access lines 236 and $436_1$, and $436_X$ described above with reference to FIG. 2A through FIG. 4B.

Memory device 500 can include areas $538_1$, $538_2$, $538_3$, and $538_4$ where parts of decoding circuitry (e.g., drivers) can be formed. For example, memory device 500 can include drivers similar to drivers 238 and driver $438_1$ through $438_X$ described above with reference to FIG. 2A through FIG. 4B. The drivers of memory device 500 can be formed in areas $538_1$, $538_2$, $538_3$, and $538_4$ to provide signals (e.g., $V_{WL}$, $V_{WL1}$, and $V_{WLX}$) to respective access lines $536_1$, $536_2$, $536_3$, and $536_4$. For example, drivers formed in areas $538_1$ and $538_3$ can be used to provide signals to one group of access lines (e.g., odd access lines, such as $536_1$ and $536_3$). Drivers formed in $538_2$ and $538_4$ can be used to provide signals to another group of access lines (e.g., even access lines, such as $536_2$ and $536_4$). Arranging the reference data lines (e.g., $544_1$, $544_2$, $544_3$, and $544_4$) as shown in FIG. 5 may leave a portion of a total voltage increase in some of access lines $536_1$, $536_2$, $536_3$, and $536_4$ un-compensated during a read operation. However, this un-compensated portion of the total voltage increase may be negligible and may not impact the overall improvement in the compensation described herein. The reason is that the access line resistance associated with access lines $536_1$, $536_2$, $536_3$, and $536_4$ and the current (e.g., $I_{REF}$) following through them during a read operation can be relatively small in comparison to the total resistance of routings associated with a combination of drivers and access lines $536_1$, $536_2$, $536_3$, and $536_4$. Since the access line resistance and the current flowing through them are relatively small, an un-compensated portion of the total voltage increase can be relatively small and may be negligible.

As shown in FIG. 5, data lines $544_1$ and $544_2$ are arranged such that they can be closer to the drivers in areas $538_1$ and $538_3$ than other conductive lines (e.g., 540, $544_3$, and $544_4$). Data lines $544_1$ and $544_2$ are also arranged such that they can be farther from drivers in areas $538_2$ and $538_4$ than other conductive lines (e.g., 540, $544_3$, and $544_4$). Similarly, data lines $544_3$ and $544_4$ are arranged such that they can be closer to the drivers in areas $538_2$ and $538_4$ than other conductive lines (e.g., 540, $544_1$, and $544_2$). Data lines $544_3$ and $544_4$ are also arranged such that they can be farther from drivers in areas $538_1$ and $538_3$ than other conductive lines (e.g., 540, $544_1$, and $544_2$). Using data lines (e.g., $544_1$, $544_2$, $544_3$, and $544_4$) that are located in areas 598 and 599 (e.g., at the edges of memory array 502) and near decoding circuitry (e.g., near areas $538_1$, $538_2$, $538_3$, and $538_4$) as reference data lines may reduce impact on decoding operations and die size in memory device 500.

The illustrations of apparatuses (e.g., memory devices 200A, 200B, 300A, 300B, 400A, 400B, and 500) and methods (e.g., operating methods associated with the memory devices described herein) are intended to provide a general understanding of the structure of various embodiments and are not intended to provide a complete description of all the elements and features of apparatuses that might make use of the structures described herein. An apparatus herein refers to, for example, circuitry, a device (e.g., memory devices 200A, 200B, 300A, 300B, 400A, 400B, and 500) or a system (e.g., a computer, a cellular phone, or other electronic system) that includes a device such as memory devices 200A, 200B, 300A, 300B, 400A, 400B, and 500.

Memory devices 200A, 200B, 300A, 300B, 400A, 400B, and 500 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

The embodiments described above with reference to FIG. 1 through FIG. 5 include apparatuses and methods having a first memory element and a first select component coupled to the first memory element, a second memory element and a second select component coupled to the second memory element, and an access line shared by the first and second select components. At least one of the embodiments can include a circuit to generate a signal indicating a state of the second memory element based on a first signal developed from a first signal path through the first memory element and a second signal developed from a second signal path through the second memory element. Other embodiments including additional apparatus and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first select component, and a first variable resistance material element coupled to the first select component;
a second select component, and a second variable resistance material element coupled to the second select component;
a first transistor coupled to a supply node;
a second transistor coupled between the first transistor and the second variable resistance material element;
a node to provide a voltage, and a resistor coupled between the first variable resistance material element and the node, wherein the resistor is different from the first variable resistance material; and
a comparator including a first input node coupled to the node and a second input node coupled to the second variable resistance material element.

2. The apparatus of claim 1, wherein the circuit includes an output node to provide a signal having a first level when the second variable resistance material element has a first state and a second level when the second variable resistance material element has a second state.

3. The apparatus of claim 1, wherein the first select component includes a first bipolar junction transistor, and the second select component includes a second bipolar junction transistor.

4. An apparatus comprising:
a first select component, and a first variable resistance material element coupled to the first select component;
a second select component, and a second variable resistance material element coupled to the second select component;
a first transistor coupled to a supply node;
a second transistor coupled between the first transistor and the second variable resistance material element;
a circuit to compare a first voltage generated based on a first current through the first variable resistance material element with a second voltage generated based on a second current through the second variable resistance material element; and
a node to provide the first voltage, and a resistor coupled between the first variable resistance material element and the node, wherein the resistor is different from the first variable resistance material.

5. The apparatus of claim 4, wherein the resistor has a resistance value, such that a value of the first voltage is greater than a value of the second voltage when the second variable resistance material element has a first state, and such that the value of the first voltage is less than the value of the second voltage when the second variable resistance material element has a second state.

6. The apparatus of claim 1, wherein the first voltage includes a sum of at least the voltage on an access line coupled to the first select component and the voltage across the first variable resistance material element, and the second voltage includes a sum of at least the voltage on the access line coupled to the second select component and the voltage across the second variable resistance material element.

7. An apparatus comprising:
a first select component, and a first memory element coupled to the first select component;
a second select component, and a second memory element coupled to the second select component;
a first transistor coupled to a supply node;
a second transistor coupled between the first transistor and the second memory element; and
a circuit to generate a signal indicating a state of the second memory element based on a first signal developed from a first signal path through the first memory element and a second signal developed from a second signal path through the second memory element; and
a node coupled to the first signal path, and a resistor coupled between the first memory element and the node, wherein the resistor is different from the first memory element.

8. The apparatus of claim 7, wherein each of the first and second memory elements includes a variable resistance material.

9. The apparatus of claim 7, wherein each of the first and second select components includes a non-ohmic device.

10. The apparatus of claim 7, wherein the first select component includes a first bipolar junction transistor having a base coupled to an access line, and the second select component includes a second bipolar junction transistor having a base coupled to the access line.

11. The apparatus of claim 7, wherein each of the first and second select components includes a diode.

12. The apparatus of claim 7, wherein the first signal path includes a segment through at least part of the first select component, and the second signal path includes a segment through at least part of the second select component.

13. The apparatus of claim 7, further comprising:
a third select component, and a third memory element coupled to the third select component; and
an additional circuit to generate an additional signal indicating a state of the third memory element based on the first signal and a third signal developed from a third signal path through the third memory element.

14. The apparatus of claim 7, wherein the apparatus comprises a memory device, wherein the first memory element is included in a first variable resistance memory cell of the memory device and the second memory element is included in a second variable resistance memory cell of the memory device.

15. An apparatus comprising:
- a first data line, a first variable resistance material element coupled to the first data line;
- a second data line, a second variable resistance material element coupled to the second data line;
- a first bipolar transistor coupled to the first variable resistance material element;
- a second bipolar transistor coupled to the second variable resistance material element;
- a first transistor coupled to a supply node;
- a second transistor coupled between the first transistor and the second data line;
- a circuit coupled to the first and second data lines to generate a signal indicating a state of the second variable resistance material element based on a first voltage on the first data line and a second voltage on the second data line; and
- a node to provide the first voltage, and a resistor coupled between the first variable resistance material element and the node, wherein the resistor is different from the first variable resistance material.

16. The apparatus of claim 15, wherein the circuit includes an output node to provide a signal having a first signal level when the second variable resistance material element has a first state and a second signal level when the second variable resistance material element has a second state.

17. The apparatus of claim 15, wherein the first data line is configured as a reference data line.

18. The apparatus of claim 17, further comprising a driver to provide a signal to an access line coupled to a base of the first bipolar transistor, and the first data line is located closer to the driver than the second data line.

19. The apparatus of claim 15, wherein the second transistor is to clamp the second voltage at a value.

20. The apparatus of claim 19, further comprising a third additional circuit to cause a current to flow through the first variable resistance material element to develop the first voltage and to cause the current to flow through the second variable resistance material element to develop the second voltage.

* * * * *